United States Patent [19]

Yamanaka et al.

[11] Patent Number: 5,298,764
[45] Date of Patent: Mar. 29, 1994

[54] SEMICONDUCTOR MEMORY DEVICE HAVING A FIELD EFFECT TRANSISTOR WITH A CHANNEL FORMED FROM A POLYCRYSTALLINE SILICON FILM

[75] Inventors: Toshiaki Yamanaka, Iruma; Takashi Hashimoto, Hachiouji; Naotaka Hashimoto, Kokubunji, all of Japan

[73] Assignee: Hitachi, Ltd., Tokyo, Japan

[21] Appl. No.: 846,892

[22] Filed: Mar. 6, 1992

[30] Foreign Application Priority Data

Mar. 8, 1991 [JP] Japan .................. 3-043621

[51] Int. Cl.[5] .......................... H01L 29/78
[52] U.S. Cl. ..................... 257/67; 257/393; 257/408; 257/903; 257/350
[58] Field of Search ............ 357/23.7, 59 E, 42; 257/70, 66, 67, 69, 347, 408, 393, 903

[56] References Cited

U.S. PATENT DOCUMENTS 4,236,167 11/1980 Woods .................. 357/23.7
4,980,732 12/1990 Okazawa .................. 357/42

FOREIGN PATENT DOCUMENTS 110069 8/1980 Japan .................. 357/42
1224335 3/1971 United Kingdom .............. 357/23.7

*Primary Examiner*—Rolf Hille
*Assistant Examiner*—Robert Limanek
*Attorney, Agent, or Firm*—Antonelli, Terry, Stout & Kraus

[57] ABSTRACT

In a semiconductor device and, in particular, a semiconductor memory device in which a channel region formed in a polycrystalline film of a first channel conductivity type insulated gate field effect transistor is divided into a first channel region, which is in contact with a drain region, and a second channel region and the second channel region contains a second conductivity type impurity or a first conductivity type impurity whose density is higher than the impurity density of the first channel region, the threshold voltage can be controlled and the leakage current can be made small.

20 Claims, 4 Drawing Sheets

FIG. 1
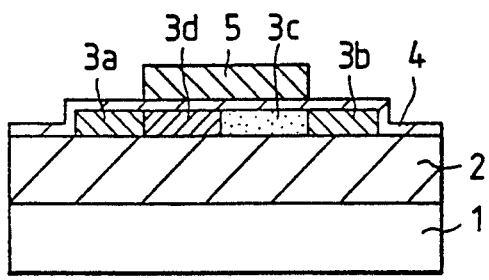
FIG. 2(a)
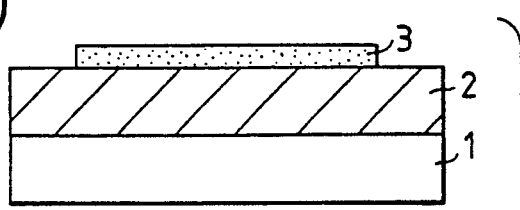
FIG. 2(b)
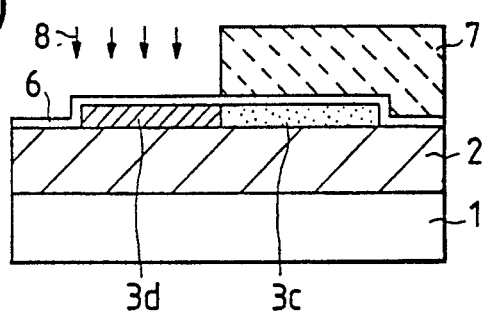
FIG. 2(c)
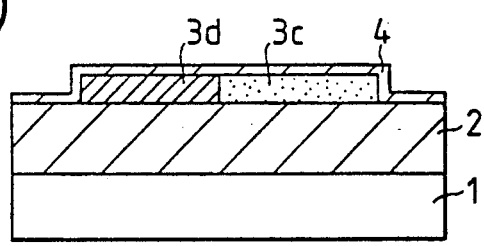
FIG. 2(d)
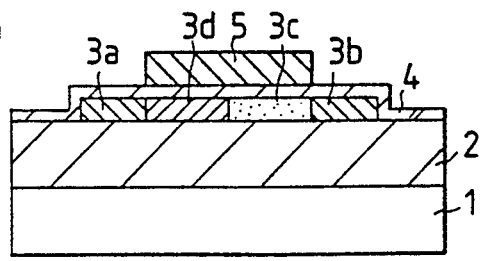

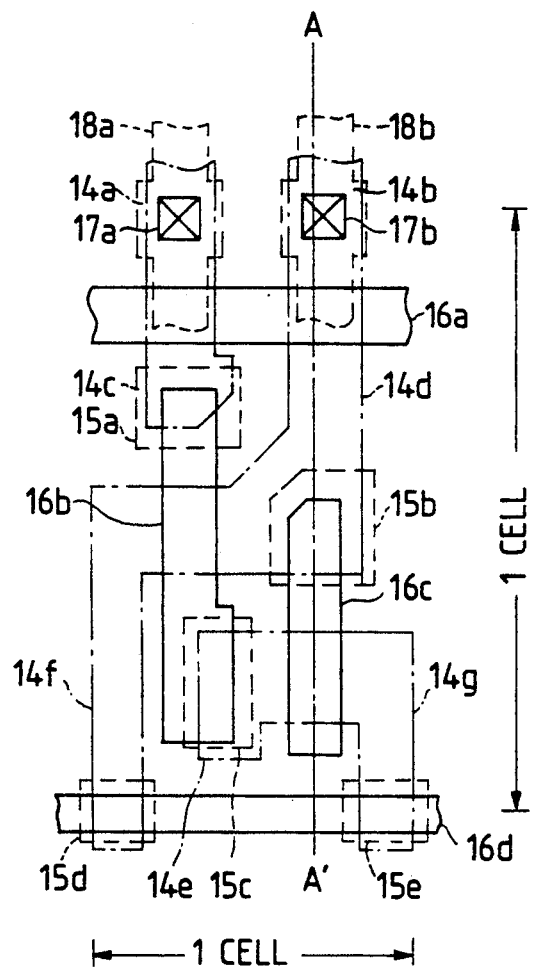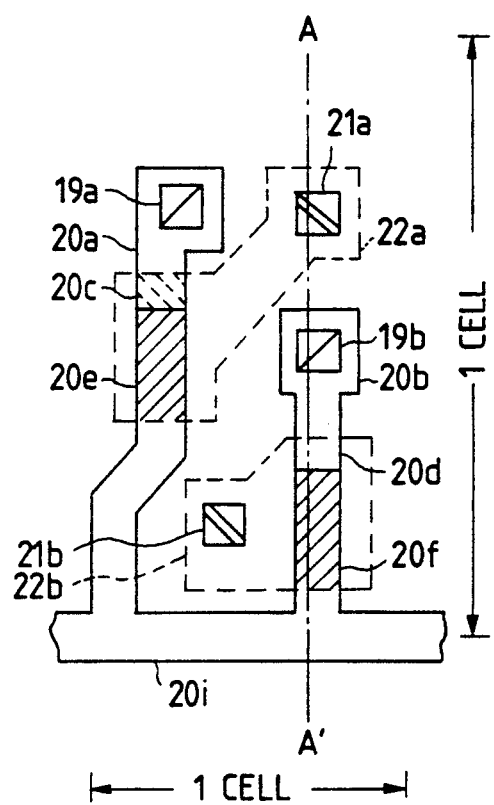

SEMICONDUCTOR MEMORY DEVICE HAVING A FIELD EFFECT TRANSISTOR WITH A CHANNEL FORMED FROM A POLYCRYSTALLINE SILICON FILM

BACKGROUND OF THE INVENTION

The present invention relates to a semiconductor device and, in particular, a semiconductor memory device having field effect transistors formed by polycrystalline silicon films.

A MIS transistor (e.g., a metal insulator semiconductor transistor or an insulated gate field effect transistor) using a polycrystalline silicon film which is formed above the surface of the semiconductor substrate is a transistor most suited to a high density integrated circuit device. FIG. 7 shows the sectional view of such a conventional transistor. The MIS transistor is composed of: a first polycrystalline silicon film for forming a source region 3a on a silicon oxide film ($SiO_2$ film) 2 which, in turn, is on a silicon substrate 1, a channel region 3', and a drain region 3b; a gate insulating film 4 formed on the above referred-to polycrystalline silicon film; and a gate electrode 5 comprising a second polycrystalline silicon film formed on the gate insulating film 4.

In a device of this type, the gate electrode 5 is used as an ion implantation mask, i.e. ions of impurity atoms, such as boron or others, are implanted in the source region 3a and the drain region 3b, and the channel region 3' of the MIS transistor is formed in a self-alignment manner. When the source region, drain region, and channel region are not formed in the self-alignment manner with the gate electrode, the source region, the drain region, and the channel region are formed by limiting the impurity atom ion implantation region using a photoresist or other scheme as an ion implantation mask. The gate electrode is placed above or under the channel region.

A device of this type is described in IEDM. Tech. Dig., December 1983, pp. 202-205.

A semiconductor device having a conventional static random access memory cell has been implemented using the above field effect transistor, which is formed by a polycrystalline silicon film to form a driver transistor, a load transistor, or a transfer transistor. An example of such a semiconductor memory device is disclosed in Japanese Patent Laid-Open 2-14564.

In the above conventional MIS transistor using polycrystalline silicon, the trap level is formed on the grain boundary of the polycrystalline silicon, carriers are trapped on this trap level, and potential barriers are formed. Therefore, it is difficult to control the threshold voltage of the MIS transistor. It is determined that a leakage current flowing between the source and drain regions when the MIS transistor is cut off is caused by a recombination current in a depletion layer which is formed on the above trap level by trapped carriers. This leakage current causes a problem that when the MIS transistor using a polycrystalline silicon film is applied to, for example, a static random access memory cell, the standby power consumption increase extremely.

Furthermore, the experimental study of the inventors of the present invention shows that when ions are implanted in the channel region by the same means as that of the well-known MOS (metal oxide semiconductor) formed on the substrate so as to control the threshold voltage of a MIS transistor having a large amount of such a trap level, there is a phenomenon found that the leakage current between the source and drain regions, which is caused by the electric field at the end of the channel region on the drain region side, increases. This trend grows as the implantation dose in the channel region increases as shown in FIG. 3.

Japanese Patent Laid-Open 62-98665 indicates that an impurity is used as a high resistance load element so as to increase the threshold voltage of a parasitic MISFET.

SUMMARY OF THE INVENTION

The first object of the invention is to provide a semiconductor device having an insulated gate field effect transistor using a polycrystalline silicon film and in which the leakage current is small and the threshold voltage can be controlled.

The second object of the present invention is to provide a semiconductor memory device having an insulated gate field effect transistor using a polycrystalline silicon film in which the leakage current is small and the threshold voltage can be controlled.

The above objects are accomplished by (1) a semiconductor device having a semiconductor substrate and a first conductivity type insulated gate field effect transistor with a channel region formed in a polycrystalline silicon film formed above the surface of the above semiconductor substrate, in which the above channel region comprises a first channel region which is in contact with the drain region and a second, different channel region and the second channel region has a second conductivity type impurity, which is opposite the first conductivity type; (2) a semiconductor device described in (1), in which the impurity density of the above second channel region is higher than the impurity density of the above first channel region and lower than the impurity densities of the source and drain regions of the above field effect transistor; (3) a semiconductor device having a semiconductor substrate and a first conductivity type insulated gate field effect transistor with a channel region formed in a polycrystalline silicon film formed above the surface of the semiconductor substrate, in which the above referred-to channel region comprises a first channel region which is in contact with the drain region and a third, different channel region and the third channel region has a first conductivity type impurity with an impurity density which is higher than the impurity density of the first channel region; and (4) a semiconductor device described in one of (1), (2), and (3), in which the gate electrode of the above field effect transistor comprises a first conductivity type polycrystalline silicon film.

The boundary between the above referred-to first channel region and second channel region and the boundary between the above referred-to first channel region and third channel region are at a distance of 0.1 $\mu$m or more from the drain region and the source region. When each of the boundaries is extremely close to the drain region so that the distance between them is less than 0.1 $\mu$m, the leakage current increases. When each of the boundaries is extremely close to the source region so that the distance between them is less than 0.1 $\mu$m, the threshold voltage cannot be adjusted easily. Both cases are undesirable.

The impurity density Of the first channel region varies with the design conditions of the field effect transistor. The density ranges usually, for example, from $1\times 10^{15}$ cm$^{-3}$ to $1\times 10^{16}$ cm$^{-3}$.

Since the impurity of the second channel region is opposite the conductivity type of that of the first channel region, there is no reason that the impurity density of the second channel region is required to be higher in principle than the impurity density of the first channel region. However, by actually producing a second conductivity type channel by doping a second conductivity type impurity to the second channel region of a channel whose overall region is of the first conductivity type, the second channel region is formed and the threshold voltage can be controlled. Therefore, the second conductivity type impurity density of the second channel region is higher than the first conductivity type impurity density of the first channel region. when the impurity density of the second channel region is higher than the impurity density of the source region, the characteristics as a channel are lost. Therefore, the impurity density of the second channel region is made lower than the impurity density of the source region.

The impurity density of the third channel region is made higher than the impurity density of the first channel region. Otherwise, the threshold voltage of the transistor cannot be controlled easily. For the same reason as that for the second channel region, the impurity density of the third channel region is made lower than the impurity density of the source region.

The above second object is accomplished by (5) a semiconductor memory device having a static random access memory including a flip-flop circuit comprising a pair of cross-coupled inverter circuits in which each inverter circuit is composed of a series connection of a driver field effect transistor and a load field effect transistor, and transfer field effect transistors connected to two memory nodes of the above flip-flop circuit, respectively, and in which each load field effect transistor is a first channel conductivity type insulated gate field effect transistor with a channel region formed in a polycrystalline silicon film, formed above the surface of the semiconductor substrate, and that such channel region comprises a first channel region (or first channel region portion) which is in contact with the drain region and a second, different channel region (or second, different channel region portion) and that the second channel region has a second conductivity type impurity which is opposite the first conductivity type; (6) a semiconductor memory device described in (5), in which the impurity density of the above referred-to second channel region is higher than the impurity density of the first channel region and is lower than the impurity densities of the source and drain regions of the above referred-to load field effect transistor; and (7) a semiconductor memory device having a static random access memory including a flip-flop circuit comprising a pair of inverter circuits in which each is composed of a series connection of a driver field effect transistor and a load field effect transistor, and transfer field effect transistors connected to two memory nodes of the above flip-flop circuit, respectively, and in which each load field effect transistor is a first channel conductivity type insulated gate field effect transistor with a channel region formed in a polycrystalline silicon film, formed above the surface of the semiconductor substrate, and that such channel region comprises a first channel region which is in contact with the drain region and a third, different channel region and that the third channel region has a first conductivity type impurity whose density is higher than the impurity density of the first channel region.

In the semiconductor device and semiconductor memory device of the present invention which are configured as mentioned above, the impurity region, that is, the second and third channel regions, which are formed in the channel region of the polycrystalline silicon film, control the threshold voltage of the MIS transistor. Since the above impurity region is not formed at the end of the channel region on the drain region side, the leakage current does not increase.

BRIEF DESCRIPTION OF THE DRAWINGS

FIG. 1 is a sectional view of a semiconductor device having a P channel MOS transistor which is an embodiment of the present invention;

FIGS. 2(a)–2(d) are schematic views for explaining the production process of the P channel MOS transistor shown in FIG. 1;

FIGS. 5a and 5b are plan views of a semiconductor memory device having a static random access memory which is an embodiment of the present invention;

DESCRIPTION OF THE PREFERRED EMBODIMENTS

Figure 3:
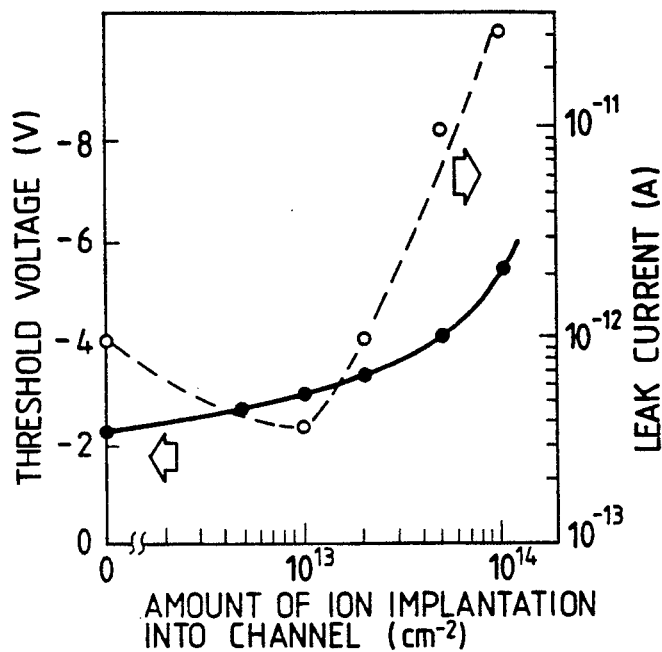
FIG. 3 is a chart showing characteristics of a conventional MOS transistor.

The details of the present invention will be explained hereunder using the disclosed embodiments.

EMBODIMENT 1

FIG. 1 shows the sectional structure of this embodiment of a P channel MOS transistor using a polycrystalline silicon film. In the drawing, a P channel MOS transistor comprising a first polycrystalline silicon film is formed on a SiO$_2$ film 2 on a silicon substrate 1. A source region 3a and a drain region 3b of the MOS transistor are regions in which a P type impurity, such as boron, is dosed to the polycrystalline silicon film respectively in a density of $10^{18}$ to $10^{21}$ cm$^{-3}$ and a first channel region 3c is formed in contact with the drain region 3b. In the channel region other than the first channel region 3c, i.e. a second channel region 3d, in which an n type impurity with a low density of, for example, $10^{16}$ to $10^{18}$ cm$^{-3}$ is dosed, is formed. The boundary between the first channel region 3c and the second channel region 3d is almost at the center between the source region 3a and the drain region 3b. The illustrative density range from $10^{16}$ to $10^{18}$ cm$^{-3}$ of the n type impurity of the second channel region 3d is set to be higher than the impurity density of the first channel region 3c and lower than the impurity density of the source region 3a.

A gate insulating film 4 with a thickness of 5 nm to 50 nm is formed on the first channel region 3c and the second channel region 3d, and a gate electrode 5 comprising a second, p type polycrystalline silicon film is formed on the gate insulating film 4.

Furthermore, an inter-layer insulating film is deposited on the gate electrode 5 and the transistor is wired with aluminum electrodes.

Next, the production method for the P channel MOS transistor of this embodiment will be described with reference to FIG. 2. FIG. 2 is a sectional view showing the production process of the P channel MOS transistor. Firstly, a $SiO_2$ film 2 with a thickness of 100 nm is deposited on the silicon substrate 1, where an active element is formed, by the low pressure chemical vapor deposition method (LPCVD method), a polycrystalline silicon film 3 with a thickness of 100 nm is deposited on it by the LPCVD method using disilane gas or others, and the source, drain, and channel regions of the MOS transistor are patterned by photolithography and dry etching ((a) of FIG. 2).

Next, the surface of the above polycrystalline silicon film 3 is oxidized in an oxygen atmosphere at 900° C. for 10 minutes so as to form a $SiO_2$ film 6 with a thickness of 10 nm, and phosphorus ions 8 are implanted in an implantation dose of $10^{13}$ cm$^{-2}$ and implantation energy of 30 keV using photoresist 7 as an ion implantation mask so as to form the second channel region 3d which is an n type low density impurity region by predetermined annealing. A region where ions are not implanted is the first channel region 3c ((b) of FIG. 2).

Next, the $SiO_2$ film 6 is removed by a hydrofluoric acid aqueous solution and a $SiO_2$ film with a thickness of 10 nm is deposited once again by the LPCVD method so as to form a gate insulating film 4 ((c) of FIG. 2). Then, a polycrystalline silicon film with a thickness of 100 nm is deposited by the LPCVD method and a gate electrode 5 is patterned by photolithography and dry etching. Boron ions 9 are implanted in an implantation dose of $10^{15}$ cm$^{-2}$ and implantation energy of 10 keV using the gate electrode 5 as an ion implantation mask, and the resistance of the gate electrode 5 is reduced by predetermined annealing. Furthermore, the gate electrode 5, source region 3a, and drain region 3b are formed in a self-alignment manner ((d) of FIG. 2).

Figure 4:
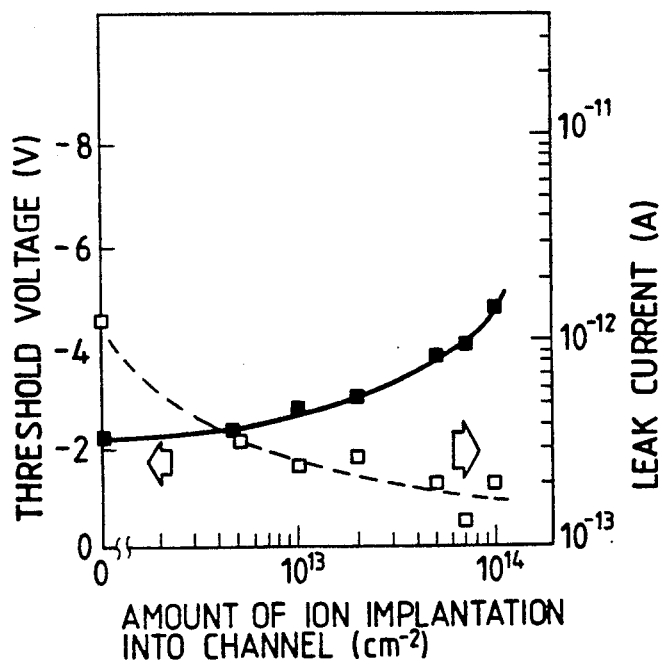
FIG. 4 is a chart showing characteristics of a MOS transistor which is an embodiment of the present invention.

Next, the effects of the present invention will be explained with reference to FIG. 4. FIG. 4 shows the relation between the threshold voltage of a P channel MOS transistor, which is produced in the same way except that the channel ion implantation dose ranges from 0 to $10^{14}$ cm$^{-2}$, and the leakage current, as influenced by the channel ion implantation dose. The drawing shows that the threshold voltage changes (increases) by about 2 V within the range of channel ion implantation dose from 0 to $10^{14}$ cm$^{-2}$ and, it is observed, the leakage current does not increase.

In this embodiment, phosphorus is used for channel ion implantation for controlling the threshold voltage. However, arsenic may be used and the implantation dose may range from $10^{13}$ to $10^{15}$ cm$^{-2}$. In this embodiment, the p type gate electrode is used so that the leakage current can be reduced. However, an n type gate electrode may be used. Furthermore, the thickness of the above polycrystalline silicon film 3 may range from 10 to 500 nm. In this embodiment, the P channel polycrystalline silicon MOS transistor is described. However, an n channel polycrystalline silicon MOS transistor can obtain the same effects only by reversing the conductive type.

EMBODIMENT 2

In a P channel MOS transistor which is the same as that of Embodiment 1, boron ions of P type impurity are implanted in the second channel region portion which is a channel region other than the first channel region. The impurity density of the second channel region portion is $10^{17}$ cm$^{-3}$, though it is generally set to, for example, $10^{15}$ to $10^{18}$ cm$^{-3}$. This is because the density range of P type impurity of the third channel region is made higher than the impurity density of the first channel region (that is, the amount of trap state density contained in the polycrystalline silicon itself) and lower than the impurity density of the source region.

In this embodiment, the boron implantation dose into the third channel region is $10^{13}$ cm$^{-2}$ and the implantation energy is 30 keV. This element can control the threshold voltage in the positive direction.

EMBODIMENT 3

Figure 8:
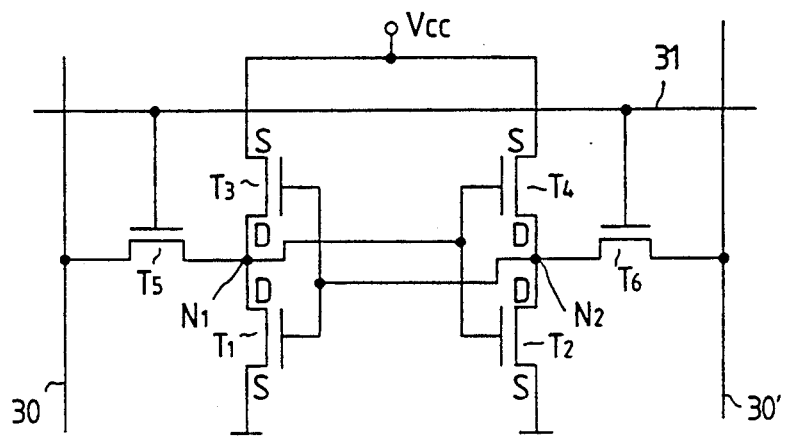
FIG. 8 is an equivalent circuit diagram of the semiconductor memory device shown in FIGS. 5(a) and 5(b).

In this embodiment, the P channel MOS transistor using a polycrystalline silicon film shown in Embodiment 1 is applied to a static random access memory. FIG. 8 shows an equivalent circuit diagram of this memory. The memory comprises a flip-flop circuit comprising a pair of cross-coupled inverter circuits, each of which having a driver MOS transistor $T_1$, ($T_2$) and a load MOS transistor $T_3$ ($T_4$) in series therewith, and transfer MOS transistors $T_5$ and $T_6$ connected to memory nodes $N_1$ and $N_2$ of the above flip-flop circuit, respectively. This flip-flop circuit is supplied with a supply voltage Vcc and a ground potential, data lines 30 and 30' are connected to the transfer MOS transistors $T_5$ and $T_6$, and a word line 31 is a common gate.

Figure 6:
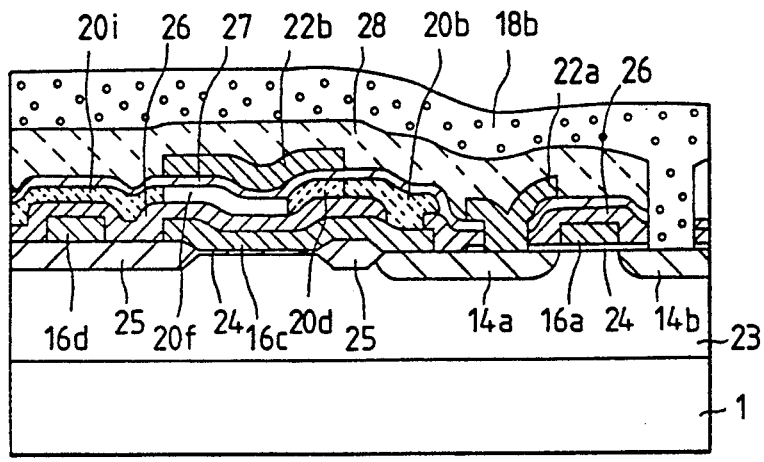
FIG. 6 is a sectional view of the semiconductor memory device shown in FIG. 5.
Figure 7:
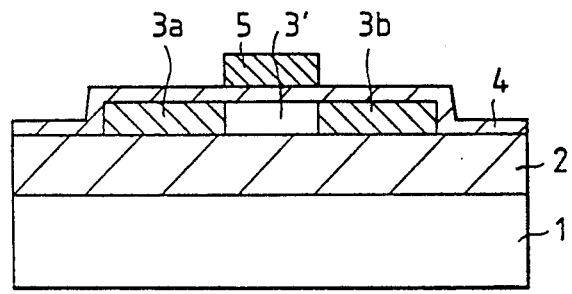
FIG. 7 is a sectional view of a conventional MOS transistor.

FIGS. 5a and 5b are plan views of this static random access memory cell, and the sectional structure on the line A-A' is shown in FIG. 6. FIG. 5a is a plan view showing an n channel driver MOS transistor, a transfer MOS transistor, a word line, and data lines. FIG. 5b shows a p channel load MOS transistor.

In FIGS. 5a, 5b, and 6, the n channel driver MOS transistors and the transfer MOS transistor are formed within a p type impurity island region (p well) 23 formed in an n type silicon substrate 1, and their gate electrodes 16a, 16b, and 16c are conductive films associated with a first conductive film layer. The gate electrodes 16b and 16c of the driver MOS transistors are cross-coupled connected to their drain regions 14e and 14d via through holes 15c and 15b. Source regions 14f and 14g of the driver MOS transistor are connected to a gate electrode 16d via through holes 15d and 15e and the gate electrode 16d is grounded.

A p channel load MOS transistor is formed on a $SiO_2$ film 26 on the above driver MOS transistor. A common source region 20i and drain regions 20a and 20b of the p channel load MOS transistors are formed in a polycrystalline silicon film which corresponds to a second conductive film layer. Furthermore, first channel regions 20c and 20d are formed in the above film, and second channel regions 20e and 20f, which are low density n type impurity regions, are formed in the channel in contact with the source region. A thin insulating film is a gate insulating film 27 of the p channel load MOS transistor and gate electrodes 22a and 22b are formed by a polysilicon film on the third layer.

Furthermore in FIGS. 5a and 5b, the drain region 14e of the driver MOS transistor, which is one of the memory nodes of the flip-flop circuit, is connected to a source region 14c of the transfer MOS transistor by the gate electrode 16b via the through holes 15c and 15a. A through hole 19a is provided in the $SiO_2$ film 26 on the source region 14c or the gate electrode 16b connected to the source region 14c, and the drain region 20a of the p channel MOS transistor formed on the polycrystalline silicon film, which is a conductive film on the second layer, is connected to it.

The same may be said with the other memory node of the flip-flop circuit. The drain region 14d of the driver MOS transistor is an impurity region which is common to the source region of the transfer MOS transistor. A through hole 19b is provided in the SiO₂ film 26 on this impurity region or the gate electrode 16c connected to this impurity region and the drain region 20b of the p channel MOS transistor formed on the polycrystalline silicon film on the second layer is connected to it.

The common source 20i of the p channel MOS transistor is also used as a wiring layer of supply voltage Vcc in the memory, and a supply voltage is supplied to the source regions of the two p channel load MOS transistors in each memory cell. The gate electrodes 22a and 22b are formed by the polycrystalline silicon film on the third layer and connected to the drain regions 14d and 14e of the n channel driver MOS transistor, which are memory nodes, via through holes 21a and 21b, respectively. The two data lines of the static memory cell are formed by aluminum electrodes 18a and 18b which are connected to the drain regions 14a and 14b of the transfer MOS transistor via through holes 17a and 17b, respectively. Numerals 24, 25, and 28 in FIG. 6 indicate a gate insulating film, a field oxide film (operates as an element separation region), and a SiO₂ film.

According to this embodiment, by adjusting the impurity densities of the second channel regions 20e and 20f which are low density n type impurity regions, the threshold voltage of the polycrystalline silicon p MOS transistor can be adjusted, the leakage current can be controlled, and the current ratio between cut off and on can be increased. Therefore, a static random access memory with low power consumption during standby and covering a minute area, with respect to a plan view, and which is most suitable for operation at a low voltage and high integration, can be provided.

In the same way as with Embodiment 2, boron ions of p type impurity may be dosed in the channel region so as to produce a p channel MOS transistor. Also in this case, the threshold voltage of the polycrystalline silicon p MOS transistor can be adjusted, the leakage current can be controlled, and the current ratio between cut off and on can be increased.

In the above embodiments, the gate electrodes of the p channel MOS transistor using a polycrystalline silicon film are formed on the channel regions. However, they may be formed under the channel regions.

According to the present invention, the threshold voltage can be controlled without an increase in the leakage current caused by field concentration at the end of the channel region of a polycrystalline silicon MOS transistor on the drain side. Therefore, a transistor with a small leakage current and a large on-off ratio can be provided and a semiconductor device and, in particular, a semiconductor memory device with low power consumption, which are suitable for operation at a low voltage, can be provided.

What is claimed is:

1. A semiconductor memory device having a static random access memory including a flip-flop circuit and transfer field effect transistors connected to memory nodes of said flip-flop circuit, respectively, said flip-flop circuit comprising a pair of inverter circuits which are cross-coupled to each other and each inverter circuit including a driver field effect transistor and a load field effect transistor in series therewith, wherein said load field effect transistor, which has a gate and source and drain regions, is a first channel conductivity type insulated gate field effect transistor with a channel region formed in a polycrystalline silicon film formed above a main surface of said semiconductor substrate, said channel region comprises a first channel region portion which is in direct contact with said drain region and a second, different channel region portion, and said second channel region portion has a second conductivity type impurity which is opposite said first conductivity type.

2. A semiconductor memory device having a static random access memory including a flip-flop circuit and transfer field effect transistors connected to memory nodes of said flip-flop circuit, respectively, said flip-flop circuit comprising a pair of inverter circuits which are cross-coupled to each other and each inverter circuit including a driver field effect transistor and a load field effect transistor in series therewith, wherein said load field effect transistor, which has a gate and source and drain regions, is a first channel conductivity type insulated gate field effect transistor with a channel region formed in a polycrystalline silicon film formed above a main surface of said semiconductor substrate, wherein said channel region comprises a first channel region portion which is in direct contact with said drain region and a second, different channel region portion, said second channel region has a second conductivity type impurity which is opposite said first conductivity type, and wherein said second channel region portion has an impurity density higher than the impurity density of said first channel region portion and lower than the impurity densities of said source and drain regions of said load field effect transistor.

3. A semiconductor memory device having a static random access memory including a flip-flop circuit and transfer field effect transistors connected to memory nodes of said flip-flop circuit, respectively, said flip-flop circuit comprising a pair of inverter circuits which are cross-coupled to each other and each inverter circuit including a driver field effect transistor and a load field effect transistor in series therewith, wherein said load field effect transistor, which has a gate and source and drain regions, is a first channel conductivity type insulated gate field effect transistor with a channel region formed in a polycrystalline silicon film formed above the surface of the semiconductor substrate, said channel region comprises a first channel region portion which is in direct contact with the drain region and a second, different channel region portion, and said second channel region has a first conductivity type impurity with an impurity density which is higher than the impurity density of said first channel region portion and lower than the impurity densities of the source and drain regions of said load field effect transistor.

4. A semiconductor memory device according to claim 1, wherein said second channel region portion consists of that part of said channel region other than said first channel region portion thereof.

5. A semiconductor memory device according to claim 4, wherein said first and second conductivity types are p-type and n-type, respectively.

6. A semiconductor memory device according to claim 2, wherein said second channel region portion consists of that part of said channel region other than said first channel region portion thereof.

7. A semiconductor memory device according to claim 6, wherein said first and second conductivity types are p-type and n-type, respectively.

8. A semiconductor memory device according to claim 3, wherein said second channel region portion consists of that part of said channel region other than said first channel region portion thereof.

9. A semiconductor memory device according to claim 8, wherein said first conductivity type is p-type.

10. A semiconductor memory device according to claim 4, wherein the gate electrode of said load field effect transistor is insulatedly disposed directly above said channel region thereof.

11. A semiconductor memory device according to claim 10, wherein said channel region and said source and drain regions are in self-alignment with said gate electrode.

12. A semiconductor memory device according to claim 11, wherein said first and second conductivity types are p-type and n-type, respectively.

13. A semiconductor memory device according to claim 2, wherein the gate electrode of said load field effect transistor is insulatedly disposed directly above said channel region thereof.

14. A semiconductor memory device according to claim 13, wherein said channel region and said source and drain regions are in self-alignment with said gate electrode.

15. A semiconductor memory device according to claim 14, wherein said first and second conductivity types are p-type and n-type, respectively.

16. A semiconductor memory device according to claim 8, wherein the gate electrode of said load field effect transistor is insulatedly disposed directly above said channel region thereof.

17. A semiconductor memory device according to claim 14, wherein said channel region and said source and drain regions are in self-alignment with said gate electrode.

18. A semiconductor memory device according to claim 17, wherein said first conductivity type is p-type.

19. A semiconductor memory device according to claim 1, wherein said first channel region portion has a first conductivity type.

20. A semiconductor memory device according to claim 4, wherein said first channel region portion has a first conductivity type.

* * * * *